United States Patent
Kiryu

(10) Patent No.: US 7,475,311 B2
(45) Date of Patent: Jan. 6, 2009

(54) SYSTEMS AND METHODS FOR DIAGNOSING RATE DEPENDENT ERRORS USING LBIST

(75) Inventor: Naoki Kiryu, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 478 days.

(21) Appl. No.: 11/215,652

(22) Filed: Aug. 30, 2005

(65) Prior Publication Data

US 2007/0050693 A1 Mar. 1, 2007

(51) Int. Cl.
*G01R 31/28* (2006.01)

(52) U.S. Cl. .................. 714/732; 714/25; 714/733; 714/724; 714/734; 714/736

(58) Field of Classification Search .................. 714/25, 714/733, 724, 732, 734, 736
See application file for complete search history.

(56) References Cited

U.S. PATENT DOCUMENTS

| | | | | |
|---|---|---|---|---|
| 5,349,587 A | * | 9/1994 | Nadeau-Dostie et al. | .... 714/729 |
| 5,680,543 A | * | 10/1997 | Bhawmik | ..................... 714/30 |
| 6,021,514 A | | 2/2000 | Koprowski | |
| 6,115,827 A | * | 9/2000 | Nadeau-Dostie et al. | .... 713/503 |
| 6,125,465 A | | 9/2000 | McNamara et al. | |
| 6,145,105 A | * | 11/2000 | Nadeau-Dostie et al. | .... 714/726 |
| 6,442,723 B1 | * | 8/2002 | Koprowski et al. | .......... 714/732 |
| 6,807,645 B2 | * | 10/2004 | Angelotti et al. | ............ 714/732 |
| 6,816,990 B2 | * | 11/2004 | Song et al. | ................... 714/729 |
| 6,904,553 B1 | * | 6/2005 | Brown | ......................... 714/731 |
| 6,966,021 B2 | * | 11/2005 | Rajski et al. | ................. 714/726 |
| 7,225,354 B2 | * | 5/2007 | Tseng | ......................... 713/503 |
| 2003/0097614 A1 | * | 5/2003 | Rajski et al. | ................... 714/30 |
| 2004/0153915 A1 | * | 8/2004 | McLaurin | ................... 714/724 |
| 2004/0230882 A1 | * | 11/2004 | Huott et al. | .................. 714/733 |
| 2005/0005051 A1 | * | 1/2005 | Tseng | ........................ 710/310 |
| 2005/0229056 A1 | * | 10/2005 | Rohrbaugh et al. | ......... 714/726 |
| 2005/0240790 A1 | * | 10/2005 | Nadeau-Dostie et al. | .... 713/400 |
| 2006/0064616 A1 | * | 3/2006 | Rajski et al. | ................. 714/726 |
| 2006/0179376 A1 | * | 8/2006 | Asaka | ......................... 714/731 |
| 2006/0271831 A1 | * | 11/2006 | Kang et al. | .................. 714/718 |
| 2007/0035336 A1 | * | 2/2007 | Lee | ............................. 327/156 |

* cited by examiner

*Primary Examiner*—John P Trimmings
*Assistant Examiner*—Guerrier Merant
(74) *Attorney, Agent, or Firm*—Law Offices of Mark L. Berrier

(57) ABSTRACT

Systems and methods for performing logic built-in self-tests (LBISTs) to detect "at-speed" errors in a digital circuit. In one embodiment, an input bit pattern is propagated through target logic of the digital circuit and captured in scan chains at a normal operating speed to produce a first output bit pattern. This is repeated with the first input bit pattern at a lower test speed to produce a second output bit pattern. Differences between the first and second output bit patterns are then detected to determine whether operation of the digital circuit at the normal operating speed causes errors that are not generated at the lower test speed.

17 Claims, 6 Drawing Sheets

SYSTEMS AND METHODS FOR DIAGNOSING RATE DEPENDENT ERRORS USING LBIST

BACKGROUND

1. Field of the Invention

The invention relates generally to the testing of electronic circuits, and more particularly to systems and methods for using logic built-in self-test (LBIST) circuitry to identify the existence of circuit defects that are manifested when the circuit is used at normal operating speeds but not when the circuit is used at slower speeds.

2. Related Art

Digital devices are becoming increasingly complex. As the complexity of these devices increases, there are more and more chances for defects that may impair or impede proper operation of the devices. The testing of these devices is therefore becoming increasingly important.

Testing of a device may be important at various stages, including in the design of the device, in the manufacturing of the device, and in the operation of the device. Testing at the design stage ensures that the design is conceptually sound. Testing during the manufacturing stage may be performed to ensure that the timing, proper operation and performance of the device are as expected. Finally, after the device is manufactured, it may be necessary to test the device at normal operating speeds ("at speed") to ensure that it continues to operate properly during normal usage.

One way to test for defects in a logic circuit is a deterministic approach. In a deterministic method, each possible input pattern is applied at the inputs of the logic circuit, with each possible set of state values in the circuit. The output pattern generated by each set of inputs and state values is then compared with the expected output pattern to determine whether the logic circuit operated properly. If the number of possible input patterns and number of states is large, however, the cost of deterministic testing of all the combinations is generally too high for this methodology to be practical. An alternative method of testing that has a lower cost is therefore desirable.

One alternative is a non-deterministic approach in which pseudorandom input test patterns are applied to the inputs of the logic circuit. The outputs of the logic circuit are then compared to the outputs generated in response to the same pseudorandom input test patterns by a logic circuit that is known to operate properly. If the outputs are the same, there is a high probability that the logic circuit being tested also operates properly. The more input test patterns that are applied to the logic circuits, and the more random the input test patterns, the greater the probability that the logic circuit under test will operate properly in response to any given input pattern. This non-deterministic testing approach is typically easier and less expensive to implement than a deterministic approach.

One test mechanism that can be used to implement a deterministic testing approach is a built-in self-test (BIST.) This may also be referred to as a logic built-in self-test (LBIST) when applied to logic circuits. BIST and LBIST methodologies are generally considered part of a group of methodologies referred to as design-for-test (DFT) methodologies. DFT methodologies impact the actual designs of the circuits that are to be tested. LBIST methodologies in particular involve incorporating circuit components into the design of the circuit to be tested, where the additional circuit components are used for purposes of testing the operation of the circuit's logic gates.

In a typical LBIST system, LBIST circuitry within a device under test includes a plurality of scan chains interposed between levels of the functional logic of the device. Pseudo-random patterns of bits are generated and stored in the scan chains. The pseudorandom bit patterns are then propagated through the functional logic of the device under test and captured in a subsequent scan chain. The data can then be examined to determine whether the results are as expected. For example, the bit patterns produced by a device under test can be compared to he bit patterns produced by a device that is known to operate properly.

This methodology can detect various different types of errors in the device under test, including "at-speed" errors (which occur when the device is operated at a normal operating speed, but not when the device is operated at a slower test speed.) This methodology cannot differentiate between at-speed errors and other types of errors—it can only detect that some type of error occurred. Further, because the bit patterns that are produced by the device during each test loop are combined with the results of many oter test loops, it is impossible to determine the sources of individual errors.

It would therefore be desirable to provide systems and methods for LBIST testing that are capable of detecting errors that only occur at normal operating speeds and that are capable of localizing the sources of these errors.

SUMMARY OF THE INVENTION

One or more of the problems outlined above may be solved by the various embodiments of the invention. Broadly speaking, the invention comprises systems and methods for performing logic built-in self-tests (LBISTs) in digital circuits. In one embodiment, the LBIST circuitry of a target circuit is initialized and executes two tests with identical data, varying only the rate used to operate the functional logic. The results of the functional logic are compared at every test loop to detect any errors (defects) that occur at one rate, but not at another. When detected, system parameters are examined and may be used to localize the defect in the functional logic.

The invention may be implemented in a variety of ways, and various exemplary embodiments will be described in detail below. In one embodiment, a device under test includes a pseudorandom pattern generator (PRPG) configured to generate bit patterns to be scanned into a set of scan chains. A shadow register coupled to the PRPG is used to reset the PRPG so that the same bit pattern can be scanned into the scan chains multiple times. Two multiple-input signature registers (MISRs) are coupled to the scan chains to receive the bit patterns captured from the functional logic of the device under test. One of the MISRs generates a signature based on the bit patterns produced at-speed, while the other MISR generates a signature based on the bit patterns produced at a slower test speed. Comparison circuitry compares the signatures of the two MISRs to determine whether there are any differences between the MIS signatures. If no differences are detected, the testing continues. If differences are detected, an error handling phase may be initiated to determine the source of the error.

One alternative embodiment comprises a system for identifying at-speed errors in a device under test including target logic within the device under test, and logic built-in self-test (LBIST) circuitry coupled to the target logic. The LBIST circuitry is configured to perform one or more test loops. In each test loop, the LBIST circuitry performs an "at-speed" test at the normal operating speed of the device, and then performs the same test at a lower test speed. For each test, whether at the higher speed or the lower speed, the same set of input bit patterns is loaded into the scan chains. The input bit pattern is then propagated through the target logic and captured at the appropriate speed. The resulting output bit patterns (or signatures based on these output bit patterns) are then compared to determine whether there are any differences between them. If there are differences, they are assumed to be at-speed errors, since both output bit patterns are produced by propagating the same input bit pattern through the same target logic. If errors are detected, error handling procedures may be performed (e.g., to analyze the errors and thereby identify the sources of the errors.)

Another alternative embodiment comprises a method for LBIST testing including generating first and second LBIST signatures by propagating the same input bit pattern through the target logic at different speeds (at the normal operating speed of the device and at a reduced speed.) The first and second LBIST signatures are then compared and any differences between the first LBIST signature and the second LBIST signature are detected. The first and second signatures may be the output bit patterns produced by the target logic and captured in the scan chains, or they may be generated from these output bit patterns (e.g., in a MISR.) If any differences between the first and second LBIST signatures are detected, an error handling phase may be performed (e.g., to localize the sources of the errors.)

Numerous additional embodiments are also possible.

BRIEF DESCRIPTION OF THE DRAWINGS

Other objects and advantages of the invention may become apparent upon reading the following detailed description and upon reference to the accompanying drawings.

Figure 1:
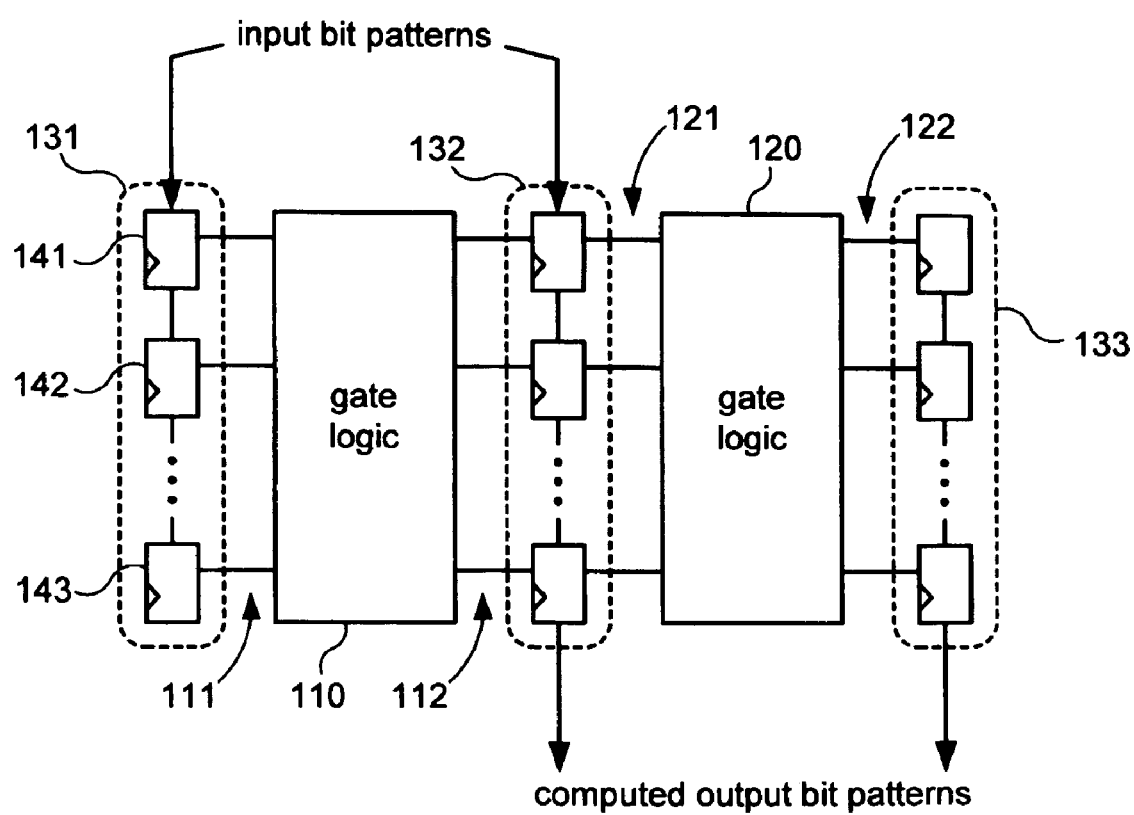
FIG. 1 is a functional block diagram illustrating the principal operation of a simple STUMPS-type LBIST system in accordance with one embodiment.

While the invention is subject to various modifications and alternative forms, specific embodiments thereof are shown by way of example in the drawings and the accompanying detailed description. It should be understood, however, that the drawings and detailed description are not intended to limit the invention to the particular embodiments which are described. This disclosure is instead intended to cover all modifications, equivalents and alternatives falling within the scope of the present invention as defined by the appended claims.

DETAILED DESCRIPTION OF PREFERRED EMBODIMENTS

One or more embodiments of the invention are described below. It should be noted that these and any other embodiments described below are exemplary and are intended to be illustrative of the invention rather than limiting.

As described herein, various embodiments of the invention comprise systems and methods associated with logic built-in self-test (LBIST) circuitry to identify the existence of "at-speed" logic circuit defects and provide data to localize the defect in the devices under test.

In one embodiment, LBIST circuitry, in conjunction with automated test equipment (ATE) is used to process input patterns through target logic within a device at two different functional rates, capturing and then comparing the computed patterns produced by the target logic. The LBIST circuitry of the target device consists of (in part) a pattern generator (e.g., a pseudorandom pattern generator, PRPG,) a shadow register for storing the PRPG state, a set of scan chains, and two multiple signal input generators (MISR's.) The device is connected to the ATE and both the PRPG and its shadow register are initialized with identical parameters from the ATE. The pattern generator is then able to scan the same input pattern into the LBIST scan chains of the device on consecutive passes.

On one pass, the ATE controller propagates the bit patterns in the scan chains through the target logic and captures the resulting bit patterns at a first rate. The captured bit patterns are then scanned into a first MISR, which generates a corresponding signature value. On a second pass, the bit patterns in the scan chains are propagated through the target logic and captured at a second rate. One or the rates is the normal operating rate (speed) of the device, while the other is a slower test rate.

The two MISR signatures are compared in the ATE to determine if there are any differences (by XOR'ing the corresponding signature bits and then OR'ing that result.) If no differences are detected, the ATE controller continues execution of succeeding test loops. That is, the next set of input data is then processed through the functional logic at the two rates, examined, and so forth, until all of the required input test patterns are processed successfully. If, at any point, differences in the signatures are detected, the test loop is halted and the LBIST data (from the XOR gate and cycle counters) is stored and examined. An error analysis can then performed to determine which scan chains, scan chain latches, or even the functional logic involved. To continue the test, the MISR signatures could be resynchronized to so that additional errors would be properly identified.

The various embodiments of the invention may provide a number of advantages over conventional systems. For example, by processing the same input bit patterns through the same target logic at different rates, rate dependent ("at-speed") errors can be identified exclusive of other types of errors.

The use of a MISR to generate a data signature is typical. Because the MISR combines each successive set of bits from the scan chains with an existing signature value, there is an inherent loss of information. Test data is not typically available at the point within a test at which an error occurs. Immediately after an error is incorporated into the signature, and prior to further calculation, the position of the differences in the two signatures is meaningful. At this point, a test can be rerun, varying the number of scan-shift cycles used to load the MISR's. The position of the difference(s)/error(s) within the XOR output indicates which of the scan chains was the source of the error. Further, the scan cycle number indicates which latch within the scan chain initially received the erroneous data and localizes the defect to a small part of the functional logic.

Various embodiments of the invention will be described below. Primarily, these embodiments will focus on implementations of a STUMPS-type LBIST architecture which is implemented within an integrated circuit. It should be noted that these embodiments are intended to be illustrative rather than limiting, and alternative embodiments may be implemented in BIST architectures other than the STUMPS architecture, and may also be implemented in circuits whose components are not strictly limited to logic components (e.g., AND gates, OR gates, and the like.) Many such variations will be apparent to persons of ordinary skill in the art of the invention and are intended to be encompassed by the appended claims.

Referring to FIG. 1 a functional block diagram illustrating the principal operation of a simple STUMPS-type LBIST system is shown. The LBIST system is incorporated into an integrated circuit. In this figure, the functional logic of the integrated circuit includes a first portion 110 and a second portion 120. Functional logic 110 is, itself, a logic circuit having a plurality of inputs 111 and a plurality of outputs 112. Similarly, functional logic 120 forms a logic circuit having a plurality of inputs 121 and a plurality and outputs 122. Functional logic 110 is coupled to functional logic 120 so that, in normal operation, outputs 112 of functional logic 110 serve as inputs 121 to functional logic 120.

Each of the inputs to, and outputs from, functional logic 110 and 120 is coupled to a scan latch. The set of scan latches 131 that are coupled to inputs 111 of functional logic 110 forms one is referred to as a scan chain. The latches are serially coupled together so that bits of data can be shifted through the latches of a scan chain. For example, a bit may be scanned into latch 141, then shifted into latch 142, and so on, until it reaches latch 143. More specifically, as this bit is shifted from latch 141 into latch 142, a second bit is shifted into latch 141. As a bit is shifted out of each latch, another bit is shifted into the latch. In this manner, a series of data bits can be shifted, or scanned, into the set of latches in scan chain 131, so that each latch stores a corresponding bit. Data can likewise be scanned into the latches of scan chain 132.

Just as data can be scanned into the latches of a scan chain (e.g., 131,) data can be scanned out of the latches of a scan chain. As depicted in FIG. 1, the latches of scan chain 132 are coupled to the outputs of functional logic 110. Each of these latches can store a corresponding bit that is output by functional logic 110. After these output bits are stored in the latches of scan chain 132, the output data bits can be shifted through the series of latches and provided as an output bit stream. Data can likewise be scanned out of the latches of scan chain 133. It should be noted that the structure illustrated in FIG. 1 does not show data being scanned into scan chain 133, or data being scanned out of scan chain 131. Alternative embodiments may be configured to scan data in and out of these scan chains.

The LBIST system of FIG. 1 operates basically as follows. Pseudorandom bit patterns are generated and are scanned into the scan chains (131, 132) that are coupled to the inputs of functional logic 110 and 120. The pseudorandom bit patterns that are stored in scan chains 131 and 132 are then propagated through the corresponding functional logic. That is, the bit pattern in scan chain 131 is propagated through functional logic 110, while the bit pattern in scan chain 132 is propagated through functional logic 120. Functional logic 110 and 120 process the inputs and generate a corresponding set of outputs. These outputs are captured (stored) in the scan chains (132 and 133) that are coupled to the outputs of the functional logic. The output bit patterns stored in scan chains 132 and 133 are then scanned out of these scan chains.

Figure 2:
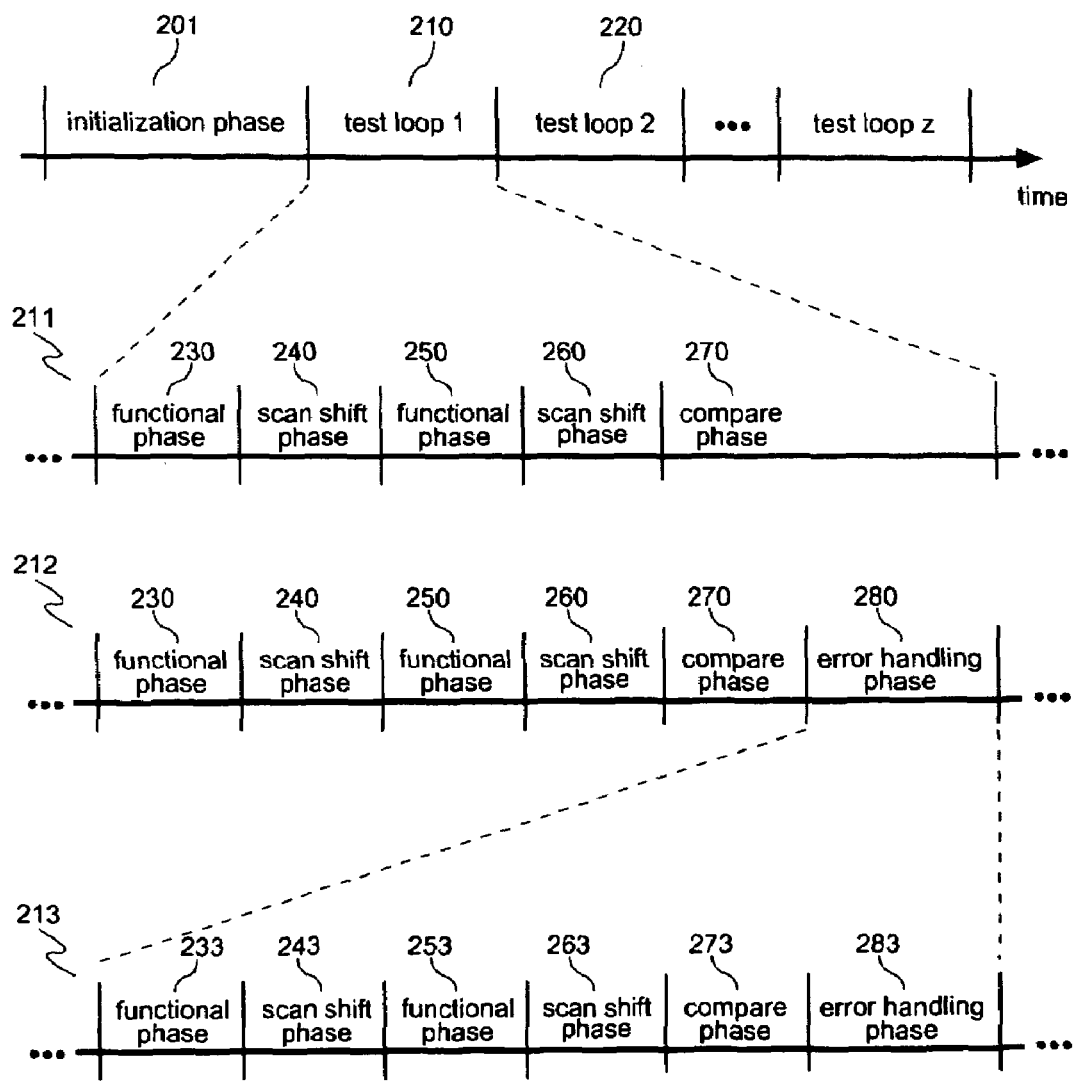
FIG. 2 is a diagram illustrating the phases of operation of the LBIST system in accordance with one embodiment.

Referring to FIG. 2, a diagram illustrating the phases of operation of the LBIST system in accordance with one embodiment is shown. The device is operated at two different functional rates. If there are no "at-speed" defects, given identical inputs (input data and command signals) and operated at any rate, identical results are generated.

FIG. 2 shows several different phases of operation of the LBIST system. Nominally, there are initialization, functional, scan-shift, and compare phases. A compare phase occurs at the end of the scan-shift phase and may be followed by an error handling phase. The error handling phase may itself contain the aforementioned phases (except initialization.)

In initialization phase 201, the various components of the system are prepared for normal LBIST operation (i.e., execution of test loop 210 followed by test loop 220, and so forth.) This may include resetting various components, providing a seed for the PRPG, setting values in registers, scanning initial bit patterns into the scan chains, and so on. In functional phase 230, data propagated through the functional logic of the device in which the LBIST system is implemented is captured in the scan chain latches. The interval between completion of the scanning of the input bit pattern into the scan chains and capture of the resulting bit patterns in the succeeding scan chains corresponds to a first rate (e.g., the normal operating speed of the device.) In scan shift phase 240, data is scanned into and out of the scan chains of the LBIST system. The data is scanned out into a first one of two MISR's. In functional phase 250, data is loaded from the shadow register into the PRPG, and the corresponding input bit patterns are again propagated through the functional logic of the device under test. In this phase, however, a different rate is used than in functional phase 230. In this embodiment, the rate is lower than the first rate (i.e., the functional results are captured after a longer period than in phase 230.) In scan shift phase 260, data is scanned into and out of the scan chains of the LBIST system. The data is scanned out of the scan chains and into the second of the two MISR's. Comparisons are made of the output data signatures of the two MISR's in compare phase 270. If an error is detected, the operation of various components of the LBIST system is (temporarily) suspended in order to enable analysis of data within the system. Execution of the LBIST test may be subsequently restarted to localize the defect or to continue testing with different input test patterns.

As shown in FIG. 2, operation of the LBIST system begins with initialization phase 201. As noted above, the various components of the system are prepared for normal operation during this phase. It may be necessary to ensure that several registers (e.g., test counter register, scan-shift counter register, bit monitor register) have the appropriate values stored therein. Because the first test loop (210) in the embodiment depicted in FIG. 2 begins with a functional phase (230,) it is also necessary in the initialization phase to generate a first set of pseudorandom bit patterns and to load these bit patterns into the scan chains that are interposed between the functional logic of the device under test. After these operations are performed, the LBIST system is ready for operation.

Following initialization phase 201, the LBIST system begins a first test loop 210. If the examination of the MISR signature or other data indicates that the functional logic of the device under test operated properly during the first test loop 210, the system proceeds to a second test loop 220 (again beginning with a functional phase) and so on, to fulfill the requisite test termination conditions (e.g., completion of a predetermined number of test loops.)

Test loop 210, as well as subsequent test loops, can have various phases. Examples of the phases within each test loop are shown in FIG. 2. Exemplary test loop structures 211 and 212 both include functional phase 230, scan shift phase 240, functional phase 250, scan shift phase 260, and compare phase 270. Compare phase 270 is followed in example 212 by an error handling phase 280. Error handling phase 280 may include only a data forwarding phase, or an iterative set of phases designed to localize the source of a detected error. These phases may be the same phases that are included in the test loops, as shown by exemplary structure 213.

During functional phases 230 and 250, the data that was scanned into the scan chains is propagated through the functional logic of the device under test and captured in the succeeding scan chains. At the end of a functional phase, the output of the functional logic resides in the scan chains. As noted above, a scan chain that is positioned between successive functional logic blocks serves to both provide inputs to one of the functional logic blocks and capture the outputs of the other functional logic block. The data that is captured in the scan chains at the end of the functional phase is scanned out of the scan chains during scan-shift phase 240 (and 260.) At the same time the captured data is scanned out of the scan chains, pseudorandom bit patterns are scanned into the scan chains to prepare for the next functional phase of the current or the next test loop, as appropriate.

At the end of each functional phase, the resulting captured data is scanned out of the scan chains and examined (during the subsequent compare phase.) During the compare phase of a test loop, data that is scanned out of the scan chains following the first functional phase is compared to data scanned out of the scan chains following the second functional phase to determine if an error occurred. If necessary, the LBIST testing may be suspended, or halted, to enable diagnosis of malfunctions using the available data (in the error handling phase.) The test loops can be repeated a predetermined number of times and then automatically halted if no errors are detected.

During initialization phase 201 and scan-shift phase 240, the same input pattern is scanned into the scan chains and subsequently propagated through the functional logic during functional phases 230 and 240. As part of initialization phase 201, prior to scan chain initialization, the PRPG state is set to a first state. In one embodiment, the PRPG comprises a linear feedback shift register, and the state of the PRPG is set by storing a seed value in this register. The PRPG shadow register is initialized to this same PRPG state (i.e., it stores the same value.) This first PRPG state is used to generate the first input pattern which is scanned into the scan chains during initialization phase 201. The PRPG state is then reset to the first PRPG state, prior to scan-shift phase 240 and the first input pattern (which was used in functional phase 230) is again scanned into the scan chains and used in functional phase 260.

It should be noted that, while the first functional phase of the first test loop uses a bit pattern that is stored in the scan chains during the initialization phase, the first functional phase of subsequent test loops uses a bit pattern that is stored in the scan chains during a previous test loop. References to these functions in the initialization phase should therefore be construed to include the same functions in the test loops.

The PRPG shadow register can be configured to store one or more PRPG seed values. If a PRPG shadow register can store two states is used, the PRPG state at the beginning of scan-shift phase 260 (a second PRPG state) is stored in the PRPG shadow register. During scan-shift phase 260, the output of functional phase 250 is scanned out as a second input pattern is scanned into the scan chains (in preparation for the next functional phase within the next test loop.) If no error is detected in compare phase 270 and duplication of the first input pattern is not required by an error handling phase (such as 280,) the next test loop will then make use of the second input pattern. If an error is detected, and additional functional phases are required during error handling, the PRPG will be reset to the first PRPG state and the first input pattern will be scanned into the scan chains for a number of times necessary for the analysis. At the end of that analysis, the PRPG can be set to the second PRPG state and the second input pattern generated in preparation for the second test loop. This process is carried out similarly for all test loops.

If a PRPG shadow that can store a single PRPG state is used, the PRPG will continue to be reset to the first PRPG state, and the first input pattern will continue to be generated and scanned into the scan chains until such time as an error is not detected. The PRPG shadow then stores a second PRPG state from which a second input pattern will be generated and scanned into the scan chains. The first functional phase of the next test loop will then be carried out using this new input pattern. In preparation for the second functional phase of the next test loop, the PRPG is set to the second PRPG state and the process continues.

In one embodiment, as the captured data is scanned out of the scan chains, it is provided to a multiple input signature register (MISR) and the signature contained in the MISR is updated using this data. The at-speed data is used to update one of the MISR's, while the lower-speed data is used to update the other of the MISR's. The signatures in both MISR's of the device are then compared. (See FIGS. 4 and 5.) If the signatures match, no at-speed defects are detected, and the system proceeds to the next test loop. If the signatures do not match, then the device under test has produced different results at the two different speeds. It is assumed that the error occurred at the higher speed, rather than the lower speed. Upon detection of the error, the system enters an error handling phase.

During the compare phase 270 and the error handling phase 280, the scan shift operations of the LBIST system are halted (or temporarily suspended.) While these operations are suspended, the state of the system is maintained so that the system can be examined and the scan shift operations can be resumed without having to re-initialize the system. Operation of the system can be resumed after the compare phase or, if necessary, after the error handling phase. (It should be noted that, in the event of an error, the MISR signature would need to be reset in order to continue.)

If the examination of the MISR (or other captured data) indicates that a malfunction has occurred in the device under test, diagnosis of the malfunction may proceed using the captured data, MISR data, or other data that may be available within the LBIST system. The operation of the present LBIST system can be suspended or halted upon the occurrence of a malfunction, the system contains data that can be useful in the diagnosis of the malfunction.

In one embodiment, error handling phase 280 itself contains the same phases as a test loop (see test phase structure 213,) although the MISR signatures are created using a smaller number of scan-shift cycles. In one embodiment this is accomplished by resetting each of the MISR's at the same point during their respective scan-shift phases. In an alternative embodiment, each of the MISR's is enabled only during a portion of the scan-shift phase. Various search strategies are well known and the strategy for choosing the particular scan cycles will not be discussed here, as this is beyond the scope of the present disclosure.

Figure 3:
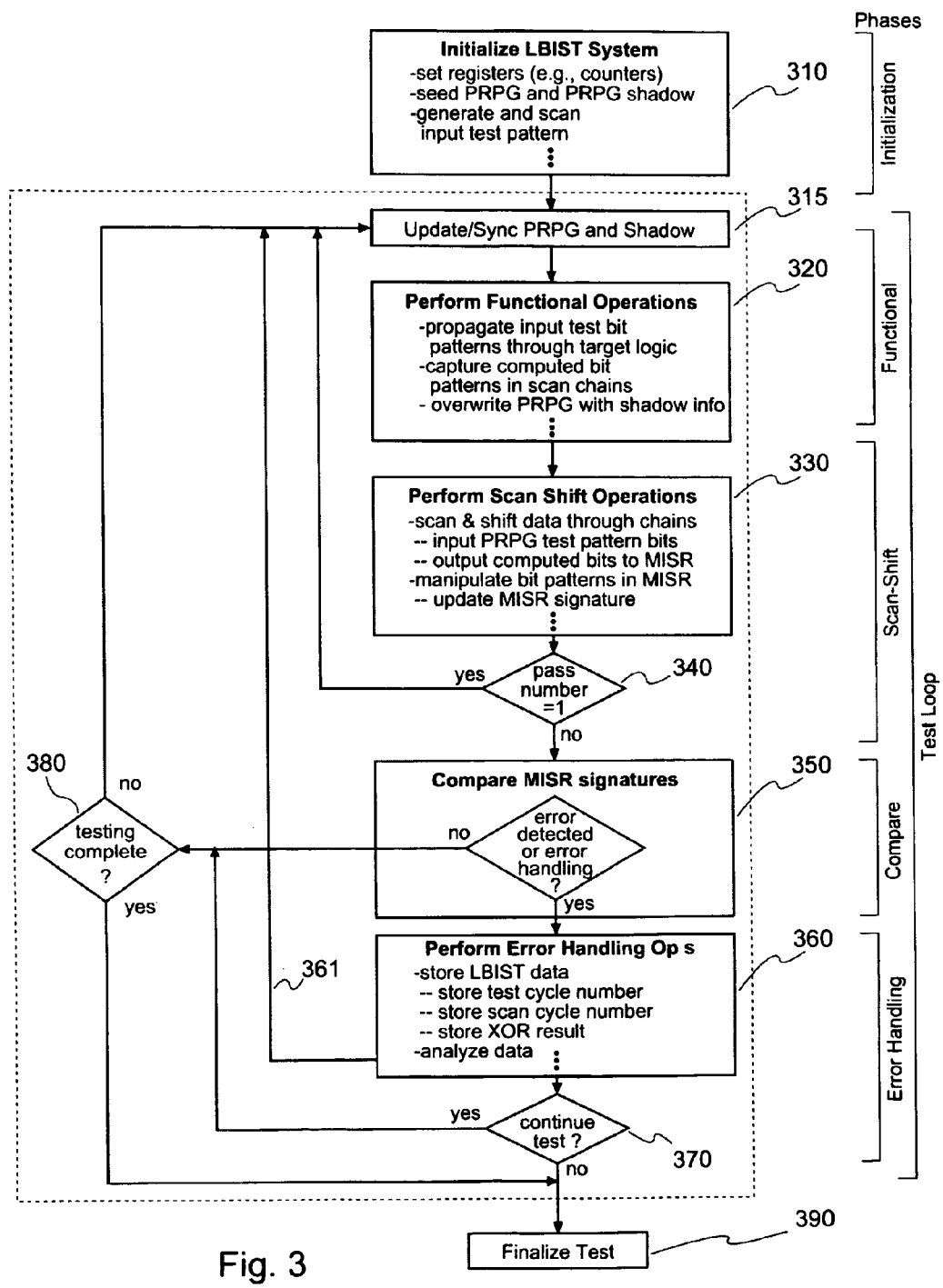
FIG. 3 is a diagram illustrating the operations within each phase in accordance with one embodiment.

The operation of the LBIST system is summarized in FIG. 3. This figure is a flow diagram illustrating the initialization of the system and the repeating test loops that are performed. Also illustrated are the major decision points for each test loop.

Referring to FIG. 3, operation of the system begins with the initialization of the LBIST components (block 310.) The PRPG state is also initialized and saved to the PRPG shadow during the initialization phase (block 310.) The PRPG state is written to or overwritten by the PRPG shadow as necessary to produce a new or a previous input test pattern, respectively, as needed (block 315.) After the system is initialized, a functional phase is executed. In the functional phase, input bit patterns that have just been shifted into the scan chains are propagated from the scan chains through the functional logic, and the resulting bit patterns are captured in the scan chains (block 320.) Next, the system executes a scan shift phase (block 330) in which each of the bits of the captured bit patterns are scanned out of the scan chains. At the same time, the bits of an input bit pattern are scanned into the scan chains in preparation for another functional phase. The input test pattern is the same as the one that was just used in the previous functional phase. The bits scanned out of the scan chains are used to update the MISR signature bits of MISR A.

Next, the second functional phase is executed. In this phase, the input bit patterns that have just been shifted into the scan chains (which are the same ones used in the previous functional phase) are propagated from the scan chains through the functional logic, and the resulting bit patterns are again captured in the scan chains (block 320.) After this functional phase, the system executes a second scan shift phase (block 330) in which each of the bits of the captured bit patterns are scanned out of the scan chains, while new bits of a input bit pattern are scanned into the scan chains. The bits that are scanned out of the scan chains are used to update the signature bits of MISR B, which are then immediately compared with signature bits of MISR A during the compare phase. During the compare phase, the functional and scan shift operations of the system are suspended. If no difference between the MISR signatures is detected (block 350,) the system continues by entering the next test loop (block 350 to block 380 to block 315.) If all test loops have been performed, the testing terminates (block 350 to block 380 to block 390.)

Figure 4:
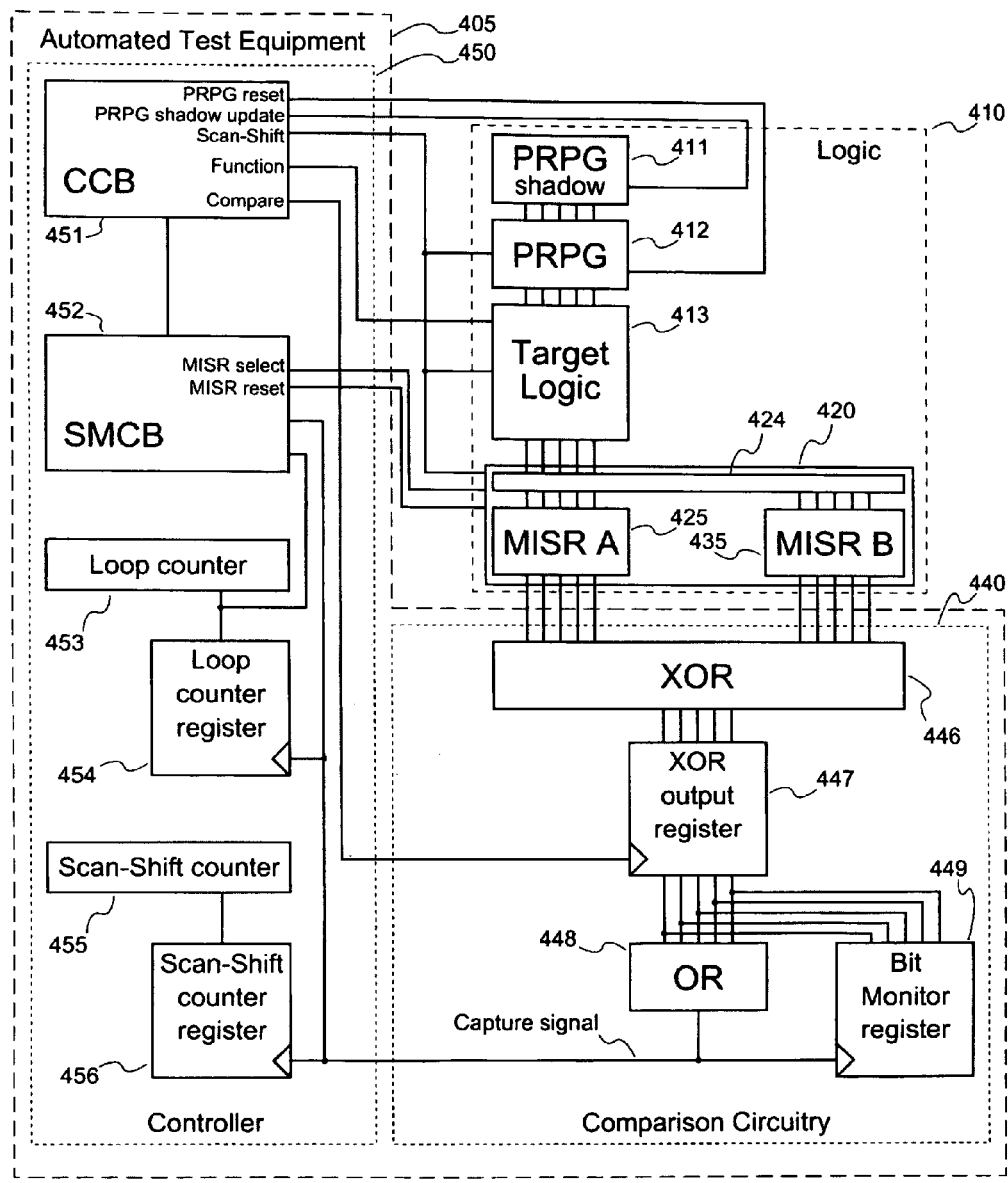
FIG. 4 is a functional block diagram illustrating an LBIST architecture that can be used in conjunction with the testing of logic circuits in accordance with one embodiment.

In one embodiment, the LBIST system is implemented as shown in the functional block diagram of FIG. 4. As depicted, a STUMPS-type architecture comprises an LBIST controller 450, including state machine control block (SMCB) 452 and clock control block (CCB) 451, counters 453 and 455, and registers 454 and 456. The system also includes LBIST components that may reside on the device under test, including PRPG shadow register 411, PRPG 412, a set of scan chains interspersed in target logic 413, MISR's 425 and 435, and MISR switch 424, which is configured to select the targeted one of MISR's 425 and 435. Comparison logic 440 includes logic gates 446 and 448, as well as XOR output and bit monitor registers 447 and 449.

It should be noted that, while only four connections to the scan chains are depicted in FIGS. 1 and 4, there may be many scan chains in the LBIST design. Also, all or some of the components may reside on-chip with the target logic. These LBIST components may, in different embodiments, be part of the ATE or they may be integrated with logic circuit 410 which the LBIST components are designed to test.

The operation of LBIST components within 410 and 440 is controlled by LBIST controller 450, which generates the control signals necessary to execute the phases of operation depicted in FIG. 2 (i.e., the initialization, function, scan shift, compare, and error handling phases.) The generation of these control signals is performed in this embodiment by clock control block 451, operating in conjunction with state machine control block 452. In one embodiment, LBIST controller 450 is configured to generate control signals by selectively gating a clock signal generated by a PLL. A test loop counter (453) and scan-shift counter (455) track the number of test loops and the number of scan-shifts within each test loop, respectively. The counter registers (454 and 456) capture the counter values in the event an error is detected. This information, in conjunction with the information in bit monitor register 449, provides data used to localize defects in the target functional logic.

For purposes of clarity, the structure of LBIST controller 450 is simplified in the figure. For example, LBIST controller 450 is depicted as having only two major components (CCB 451 and SMCB 452) and providing signals to only some of the other LBIST components within Logic 410 and comparison circuitry 440. The controller typically has additional connections and is coupled directly to each of the LBIST components. LBIST controller 450 also performs functions that are not illustrated or described in detail, such as providing seed values to PRPG 412 and PRPG shadow register 411 which are used to generate pseudorandom sequences of bits.

The purpose of PRPG 412 is to generate pseudorandom sequences of bits. The pseudorandom sequence of bits generated by PRPG 412 is the input pattern to be propagated through the functional logic components of logic circuit 413. The pseudorandom sequences are thereby provided to each of the scan chains interspersed within the target logic. There are various kinds of PRPG's. A PRPG can, for example, be implemented as a linear feedback shift register (LFSR.) It should be noted that other components may be incorporated at this stage. For instance, the pseudorandom bit sequences can be processed by a phase shifter prior to being loaded into the scan chains. The PRPG shadow register is used to store the state of the PRPG (or possibly multiple states.) The state is saved (stored) at the start of the scan-shift phase so that the PRPG can be reset. It may be necessary to reset the PRPG by overwriting the value in the PRPG with the value stored in the PRPG shadow register. This provides the means to produce an input bit pattern identical to that produced in a previous scan-shift phase.

After the pseudorandom bit patterns have been allowed to propagate through the functional components of target logic circuit 413 and the results have been captured in the scan chains, the contents of the scan chains are scanned out of the scan chains (i.e., they are unloaded from the scan chains) through switch 424 to a MISR (either MISR A 425 or MISR B 435) as directed by switch 424. In alternative embodiments, more complex circuitry may allow the number of bits passed to the MISR to be reduced, thereby reducing the size of the MISR. This could, however, obfuscate errors and hinder the analysis of those errors.

Switch 424 directs the output to one MISR for the first use of an input pattern and the other MISR for the next use of the identical input pattern. As explained above, one of these uses will occur at the normal operating speed of the device under test, while the other occurs at a lower speed. Depending on the error handling strategy, one or both of the MISR's may be reset and/or overwritten during an error handling phase.

As noted above, the bits from scan chains within 413 are provided to one of MISR's 425 or 435. The MISR provides a means to observe test results. Typically, a MISR generates a cumulative value that is based upon the output of the scan chains at each cycle. For example, in one embodiment, the MISR XOR's each bit of the MISR signature with a corresponding bit received from the scan chains. This computation is performed, and the value stored in the MISR is updated, during each scan cycle. The cumulative value stored in the MISR (the signature) is then examined after some number of scan cycles. In one embodiment, the MISR signatures are examined after an identical input pattern is processed through the functional logic and into each MISR (i.e., after the second scan cycle of a test loop.) For example, the signature value in MISR 425 corresponding to a first pass at a first speed could be compared with the signature value in MISR 435 corresponding to a second pass at a second speed.

The data stored in MISR 425 (or 435) can be read out of the device, for instance, via a JTAG port of the device into which the LBIST components are incorporated. ("JTAG" stands for Joint Test Action Group, which is the group that developed this particular type of boundary scan port.) The device may also have dedicated output ports. These ports allow the values stored in MISR A 425 to be compared to values from MISR B 435. If the signature value generated from an "at speed" test does not match a signature generated at the slower rate, then one or more of the operations performed by the functional components of logic circuit 413 must have failed when operated "at speed". An incorrect data bit is thereby set in the output scan chain, which then propagated to one of the MISR's and resulted in a signature different from that in the other MISR.

Figure 5:
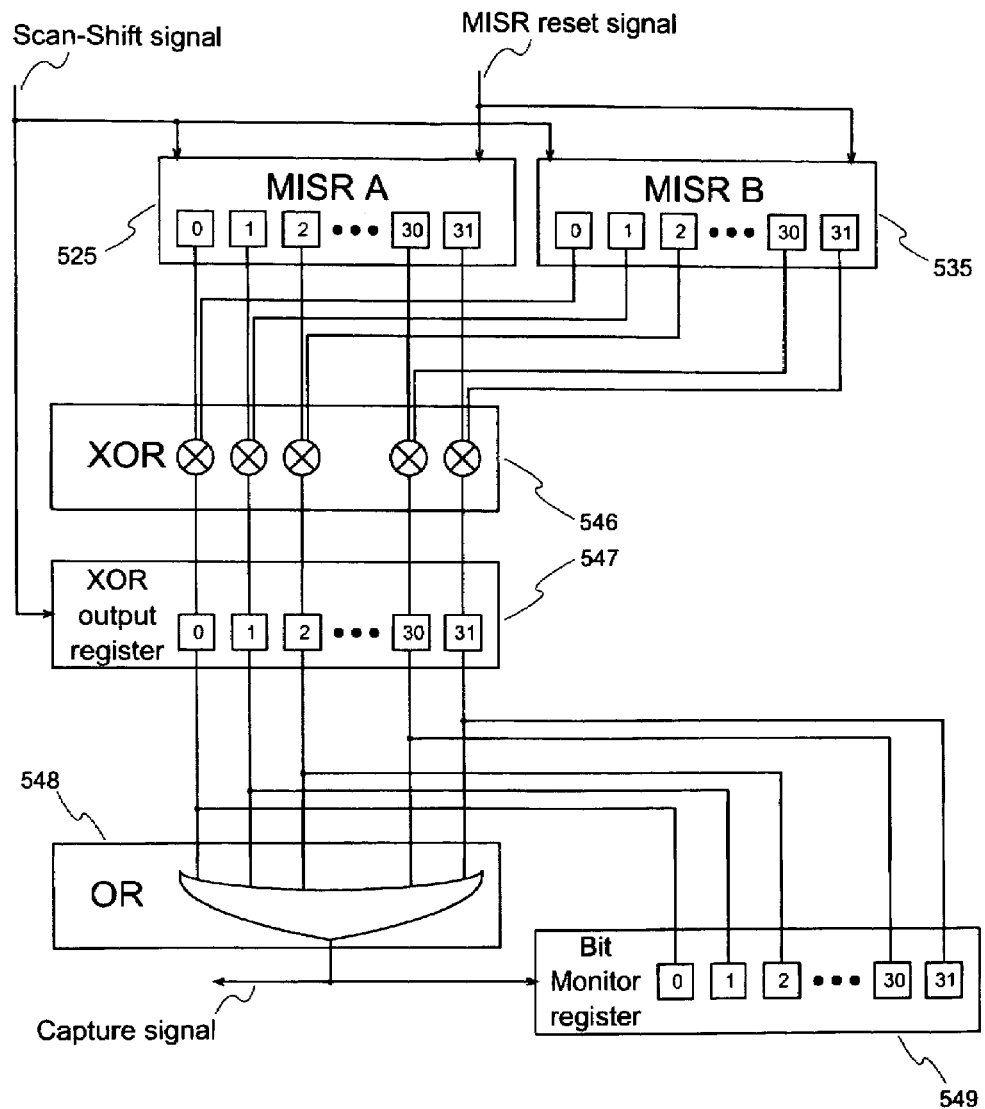
FIG. 5 is a functional block diagram illustrating the MISR signature comparison in accordance with one embodiment.

Referring to FIG. 5, a diagram illustrating the structure of the LBIST comparison logic in one embodiment is shown. During each test loop, signature data of a first pass, generated and stored in MISR A (525) is compared with the signature data of a second pass using an identical input pattern (stored in MISR B 535.) The comparison logic determines whether the signature data of the first pass matches the signature data of the second. The comparison is performed using XOR gate 546. If the two signatures match, the bits output by XOR gate 546 are all zero, leading to a zero result at the output of OR gate 548. In such a case, the capture signal is not asserted, and LBIST testing continues. If the two signatures do not match, at least one bit of XOR 546 is nonzero and the result output by OR gate 547 is nonzero. The capture signal is therefore asserted and various registers are thereby caused to store relevant information (which can be used in an analysis to determine the source of the error during an error handling phase.) This information includes the output of XOR gate 546. The XOR bits from register 547 are captured in bit monitor register 549. As part of an appropriate error analysis, the XOR bits identify the location(s) of the difference(s) between the two signatures. Also captured is the value of the scan shift counter, which can be used to identify the scan chain latch position corresponding to an error. (It should also be noted that the PRPG state used to generate the input pattern is available in the PRPG shadow.)

Figure 6:
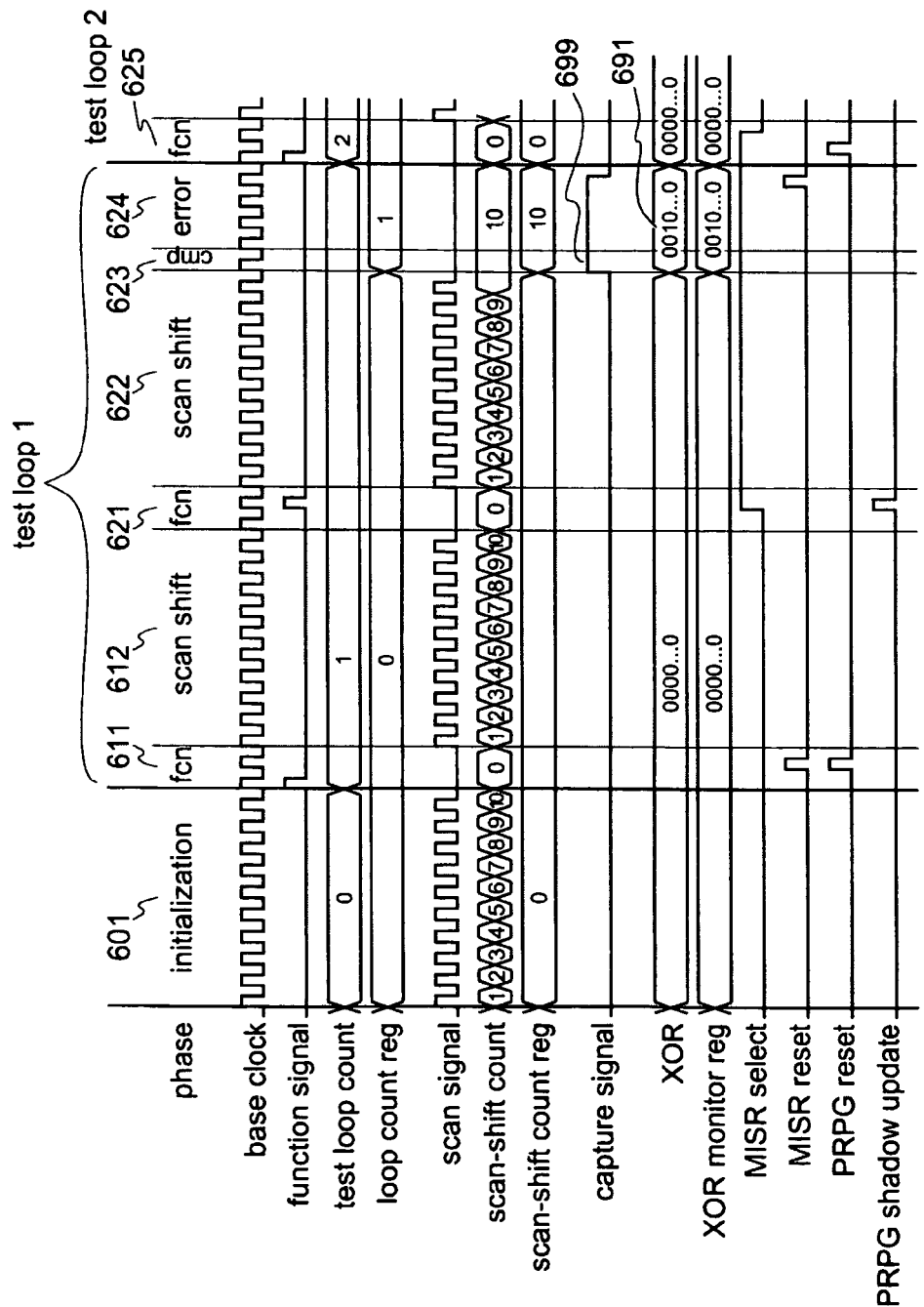
FIG. 6 is a timing diagram illustrating register values and signals associated with one embodiment.

FIG. 6 is a timing diagram for an exemplary embodiment. The timing diagram spans the initialization phase and one test loop. An error is encountered in the compare phase of the test loop. The control signals that are illustrated include the base clock (the PLL clock signal that is gated by the LBIST circuitry,) the function signal (which triggers function cycles in which data propagated through the functional circuitry is captured in the latches of a scan chain,) and the scan signal (which triggers shifting of bits into and out of the scan chains.) Also illustrated are signals triggering the overwriting/storing of PRPG states in the PRPG and its shadow register (PRPG reset, PRPG shadow update,) selection of the active MISR (MISR select signal,) and reset of the MISR's (MISR reset signal)

Also shown in FIG. 6 are the test loop/cycle counter value (test loop count,) the test loop count register value (loop count reg,) the scan-shift counter value (scan-shift count,) the scan-shift count register (scan-shift count reg,) the value at the output of the XOR gates (XOR) and the value in the XOR bit monitor register (XOR monitor reg.) There is also a signal to indicate that an error has been encountered and to trigger suspension of scan shift operations (capture signal.) When the capture signal is asserted (i.e., when an error is detected,) the values of the test loop counter, scan-shift counter and XOR gates are stored in the test count register, scan-shift count register and XOR bit monitor register, respectively.

FIG. 6 depicts an exemplary scenario in which an error is detected during a first test loop and error handling is performed followed by a second test loop. During initialization phase 601, the input test patterns are scanned into and shifted through the scan chain latches. The number of scan chain pulses is equal to the number of latches in a scan chain (10 in this example.) At the beginning of the first test loop is functional phase 611. During this phase, input test patterns from the scan chains propagate through the functional logic and are captured in the scan chain latches. The bits are propagated from the chains preceding the functional logic, through the logic, to the chains following the functional logic. One base clock cycle is used in functional phase 611 as it is the fast, "at-speed" pass. Two base clock cycles are used in functional phase 621 corresponding to the slow pass (621,) the second cycle of which is used to capture the results of the target functional logic. Each of these functional phases is followed by a scan-shift phase (612 or 622, respectively.) As noted above, the number of scan clock signal pulses is equal to the number of scan chain latches. In this example, there are ten latches requiring ten scan-shift cycles, but other embodiments could have N latches in each scan chain, requiring N scan-shifts (clock pulses.)

After each scan shift cycle (of which there are 10 in this embodiment,) the MISR signature values are updated. The signature values are then XOR'd and, in this embodiment, the XOR result bits are XOR'd during the compare phase at the end of the test phase. If no signature differences are detected, the process continues without an error handling phase. In the example of FIG. 6, a difference appears in the signatures of the two MISR's and is reflected in the XOR gate output (691,) which has changed from all 0's to "00100 . . . 0". At this point the capture signal is asserted (699.) With the assertion of the capture signal, the system enters error handling phase 624. The test count register, scan-shift count register and XOR bit monitor register capture their inputs when the capture signal is asserted. In this example, the cycle number "1" is captured in the loop count register, the number "10" is captured in the scan-shift register and "00100 . . . 0" is captured in the XOR bit monitor register.

During the error handling phase, some number of cycles is used to process and examine the LBIST data. In this example, only four cycles are shown in the error handling phase 624, but there may be any number of cycles necessary to complete error handling procedures. In one alternative embodiment, the error handling may include several functional and scan-shift phases in order to localize the defect in the logic. For example, the input pattern used to generate the error may again be generated and passed through the functional logic at the two different rates, but a reduced number of bits may then be scanned out of the scan chains. The number of bits scanned out with and without error is used to indicate the location (latch) within the specific scan chain that contains an error. During the error handling phase the MISR's are reset since one is in error. (This is necessary in the case of a MISR that accumulates the result bits.)

Those of skill in the art will understand that information and signals described herein may be represented using any of a variety of different technologies and techniques. For example, data, information, signals, bits, and symbols that may be referenced throughout the above description may be represented by voltages, currents, electromagnetic waves, magnetic fields or particles, or the like. The information and signals may be communicated between components of the disclosed systems using any suitable transport media, including wires, metallic traces, vias, optical fibers, and the like.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with application specific integrated circuits (ASICs,) field programmable gate arrays (FPGAs,) general purpose processors, digital signal processors (DSPs) or other logic devices, discrete gates or transistor logic, discrete hardware components, or any combination thereof designed to perform the functions described herein. A general purpose processor may be any conventional processor, controller, microcontroller, state machine or the like. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in software (program instructions) executed by a processor, or in a combination of the two. Software may reside in RAM memory, flash memory, ROM memory, EPROM memory, EEPROM memory, registers, hard disk, a removable disk, a CD-ROM, or any other form of storage medium known in the art. Such a storage medium containing program instructions that embody one of the present methods is itself an alternative embodiment of the invention. One exemplary storage medium may be coupled to a processor, such that the processor can read information from, and write information to, the storage medium. In the alternative, the storage medium may be integral to the processor. The processor and the storage medium may reside, for example, in an ASIC. The ASIC may reside in a user terminal. The processor and the storage medium may alternatively reside as discrete components in a user terminal or other device.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein and recited within the following claims.

What is claimed is:

1. A system and method for identifying at-speed errors in a device under test comprising:
    target logic within the device under test; and
    logic built-in serf-test (LBIST) circuitry coupled to the target logic,
    wherein the LBIST circuitry is configured to perform one or more test loops, wherein in each test loop, the LBIST circuit is configured to propagate an input bit pattern through the target logic and capture resulting output bit patterns at a normal operating speed of the target logic and at a test speed which is less than the normal operating speed of the target logic; wherein the LBIST circuitry includes a first multiple-input signature register (MISR) configured to store signatures corresponding to the output bit patterns generated at the normal operating speed and a second MISR configured to store signatures corresponding to the output bit patterns generated at the test speed; and wherein the LBIST circuitry is configured to detect differences between the output bit pattern corresponding to the normal operating speed and the output bit pattern corresponding to the test speed.

2. The system of claim 1, further comprising comparison circuitry coupled to the first and second MISR's and configured to detect differences between signatures in the first and second MISR's.

3. The system of claim 2, wherein the comparison circuitry is configured to assert a difference signal upon detection of differences between signatures in the first and second MISR's.

4. The system of claim 3, further comprising one or more registers configured to store LBIST data in response to assertion of the difference signal.

5. The system of claim 2, wherein the comparison circuitry comprises: one or more XOR gates configured to perform a bitwise XOR operation upon the signatures in the first and second MISR's; and one or more OR gates configured to perform a OR operation upon the outputs of the XOR gates.

6. The system of claim 1, further comprising: a pseudorandom pattern generator (PRPG) configured to generate the input bit patterns; and one or more shadow registers coupled to the PRPG and configured to store PRPG seed values which are used to reset the PRPG to re-generate preceding input bit patterns.

7. The system of claim 6, wherein the one or more shadow registers are configured to store a plurality of seed values corresponding to a plurality at preceding input bit patterns.

8. The system of claim 1, wherein the LBIST circuitry comprises:
    a pseudorandom pattern generator (PRPG) configured to generate the input bit patterns;
    one or more shadow registers coupled to the PRPG and configured store seed values for resetting the PRPG to re-generate preceding input bit patterns;
    a plurality of scan chains interposed with the target logic and configured to provide input bit patterns to the target logic and capture output bit patterns received from the target logic;

first and second MISR's which are selectively coupled to receive output bit patterns from the target logic and to store corresponding signature values;

a switch coupled between the scan chains and the first and second MISR's and configured to provide output bit patterns received from the scan chains to a selected one of the first and second MISR's; and comparison circuitry coupled to the first and second MISR's and configured to detect differences between signatures in the first and second MISR's.

9. A system for identifying at-speed errors in a device under test comprising:

target logic within the device under test; and logic built-in self-test (LBIST) circuitry coupled to the target logic, wherein the LBIST circuitry is configured to perform one or more test loops, wherein in each test loop, the LBIST circuitry is configured to propagate an input bit pattern through the target logic and capture resulting output bit patterns at a normal operating speed of the target logic and at a test speed which is less than the normal operating speed of the target logic, wherein the LBIST circuitry includes a first multiple-input signature register (MISR) configured to store signatures corresponding to the output bit patterns generated at the normal operating speed and a second MISR configured to store signatures corresponding to the output bit patterns generated at the test speed, and wherein the LBIST circuitry is configured to detect differences between the output bit pattern corresponding to the normal operating speed and the output bit pattern corresponding to the test speed;

comparison circuitry coupled to the first and second MISR's and configured to detect differences between signatures in the first and second MISR's, wherein the comparison circuitry is configured to assert a difference signal upon detection of differences between signatures in the first and second MISR's;

one or more registers configured to store LBIST data upon assertion of the difference signal, wherein the one or more registers are configured to store a test loop counter value, a XOR gate output value and a scan shift counter value upon assertion of the difference signal.

10. A method for LBIST testing comprising:

generating a first LBIST signature in a target logic at a normal operating speed of the target logic, wherein generating the first LBIST signature comprises generating a set of input bit patterns based on a first seed value, storing the input bit patterns in one or more scan chains interposed with the target logic, propagating the input bit patterns through the target logic, capturing a first set of output bit patterns from the target logic in the scan chains at the normal operating speed, and generating the first LBIST signature in a first multiple-input signature register (MISR) based on the output bit patterns captured at the normal operating speed;

generating a second LBIST signature in the target logic at a test speed that is less than the normal operating speed, wherein generating the second LBIST signature comprises generating the set of input bit patterns based on the first seed value, storing the input bit patterns in the scan chains, propagating the input bit patterns through the target logic, capturing a second set of output bit patterns from the target logic in the scan chains at the test speed, and generating the second LBIST signature in a second MISR based on the output bit patterns captured at the test speed;

comparing the first and second LBIST signatures; and detecting a difference between the first LBIST signature and the second LBIST signature.

11. The method of claim 10, wherein comparing the first and second LBIST signatures comprises performing a bitwise XOR operation between the first and second LBIST signatures.

12. The method of claim 10, further comprising repeating the generating, comparing and detecting steps for multiple iterations, wherein during each iteration after a first iteration, the first and second signatures are generated based on fewer bits of the respective output bit patterns than in a previous iteration.

13. The method of claim 10, further comprising, upon detecting the difference between the first LBIST signature and the second LBIST signature, terminating LBIST testing.

14. The method of claim 10, further comprising, upon detecting the difference between the first LBIST signature and the second LBIST signature, suspending LBIST testing and performing an error handling phase.

15. The method of claim 14, wherein performing an error handling phase comprises storing LBIST data in one or more registers and localizing a source of the detected difference based on the stored LBIST data.

16. The method of claim 14, further comprising terminating LBIST testing upon completion of the error handling phase.

17. The method of claim 14, wherein the error handling phase includes resetting MISR's that are used to generate the first and second signatures, wherein the method further comprises resuming LBIST testing upon completion of the error handling phase.

* * * * *